(12) United States Patent
Kojovic

(10) Patent No.: US 7,538,541 B2
(45) Date of Patent: May 26, 2009

(54) SPLIT ROGOWSKI COIL CURRENT MEASURING DEVICE AND METHODS

(75) Inventor: Ljubomir A. Kojovic, Racine, WI (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 11/593,240

(22) Filed: Nov. 6, 2006

(65) Prior Publication Data

US 2008/0106254 A1 May 8, 2008

(51) Int. Cl.
*G01R 15/18* (2006.01)
(52) U.S. Cl. ...................................... 324/127
(58) Field of Classification Search ................. 324/127
See application file for complete search history.

(56) References Cited

U.S. PATENT DOCUMENTS

| | | | | |
|---|---|---|---|---|
| 6,313,623 | B1 * | 11/2001 | Kojovic et al. | 324/127 |
| 6,624,624 | B1 * | 9/2003 | Karrer et al. | 324/117 R |
| 6,680,608 | B2 * | 1/2004 | Kojovic | 324/127 |
| 6,781,361 | B2 | 8/2004 | Nestler | |
| 6,810,069 | B2 | 10/2004 | Kojovic et al. | |
| 6,954,704 | B2 | 10/2005 | Minami et al. | |
| 7,227,347 | B2 | 6/2007 | Viaro et al. | |
| 2004/0012901 | A1 | 1/2004 | Kojovic et al. | |
| 2004/0027750 | A1 | 2/2004 | Minami et al. | |
| 2005/0248430 | A1 * | 11/2005 | Dupraz et al. | 336/200 |

OTHER PUBLICATIONS

Kojovic, L.; "Rogowski Coil Transient Performance and ATP Simulations for Applications in Protective Relaying"; Presented at the International Conference on Power Systems Transients; Jun. 19-23, 2005; Montreal, Canada.

* cited by examiner

*Primary Examiner*—Ha Tran T Nguyen
*Assistant Examiner*—Shaun Campbell
(74) *Attorney, Agent, or Firm*—King & Spalding LLP

(57) ABSTRACT

A split Rogowski coil assembly having distinct coil loops formed on printed circuit boards that are not joined to one another.

15 Claims, 3 Drawing Sheets

US 7,538,541 B2

SPLIT ROGOWSKI COIL CURRENT MEASURING DEVICE AND METHODS

BACKGROUND OF THE INVENTION

This invention relates generally to electrical power systems, and more specifically to devices for measuring current through an electrical conductor.

Rogowski coils provide a reliable means of sensing or measuring current flow at a given point in an electrical system. Current flowing through a conductor generates a magnetic field that, in turn, induces a voltage in the coil. Using the voltage output signal of the coil, actual current conditions in the conductor can be determined. With the advent of microprocessor-based protection and measurement equipment capable of calculating the current, Rogowski coils are becoming an attractive alternative to conventional current measuring devices.

DETAILED DESCRIPTION OF THE INVENTION

Electrical power generation and transmission systems typically include a number of protective devices to protect components and equipment from potentially damaging overvoltages and overcurrents. Such protective devices include, among other things, relay devices that open and close portions of the system in response to actual operating conditions. Successful operation of network protection devices in an electrical power system is of course dependent upon accurate sensing and measurement of operating conditions. Microprocessor based equipment, such as digital relay devices, are increasingly being used in electrical power systems.

Figure 1:
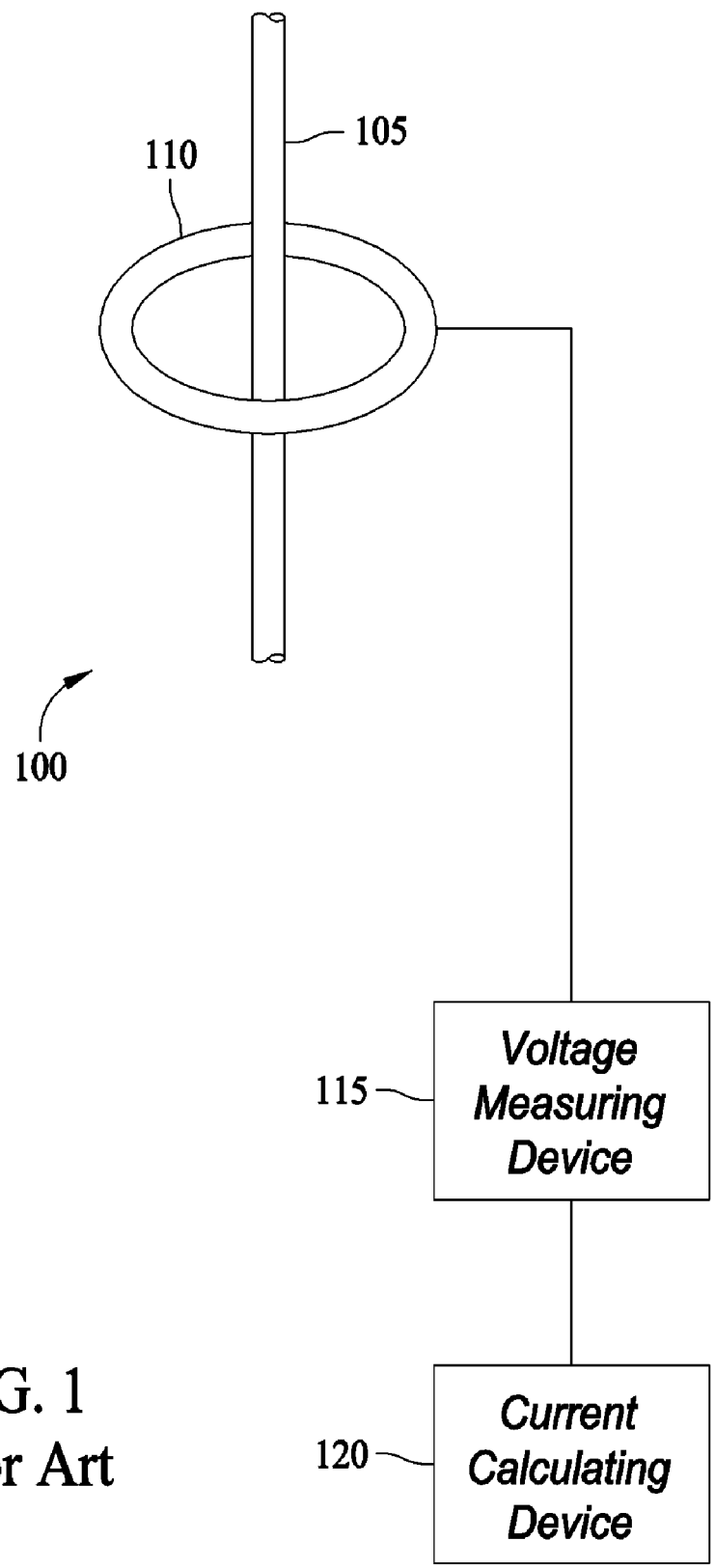
FIG. 1 is an illustration of a known system for measuring current through an electrical conductor.

Referring to FIG. 1, a system 100 is illustrated that may be used to measure a current through an electrical conductor 105. The system 100 includes a coil 110 and a voltage measuring device 115 connected to the coil 110. The voltage measuring device 115 measures a voltage induced in the coil when the electrical conductor 105 is placed within the coil 110. The voltage induced in the coil 110 is proportional to the rate of change of current in a conductor 105 passing through the coil 110. Based on the measured voltage output the coil 110, the current through the electrical conductor 105 may therefore be integrated, processed or otherwise calculated in a known manner.

To this end, the system 100 may also include a current calculating device 120, which may be a computer. The current calculating device 120 is connected to the voltage measuring device 115 to calculate the current through the electrical conductor based on the voltage measured by the voltage measuring device 115. Although shown separately from the voltage measuring device 115 in FIG. 1, the current calculating device 120 may be integral with the voltage measuring device 115.

The coil 110 may include a conductive element that is wound around a non-magnetic core. The conductive element may be, for example, a metal wire or a metal deposit. The non-magnetic core may be made of any material that has a magnetic permeability that is equal to the permeability of free space. For example, the non-magnetic core may be an air core. As another example, the coil 110 may be a Rogowski coil in which the non-magnetic core is a printed circuit board (PCB) on which the conductive element is traced. The PCB may be made of an epoxy resin filled with a substance having a low coefficient of thermal expansion such as glass or ceramic.

Ideally, the accuracy of the coil 110 to measure the current in the conductor 105 is independent of location of the conductor 105 within the coil 110. To prevent influence of nearby conductors carrying high currents, the coil 110 may be designed with two-wire loops connected in electrically opposite directions and turning in opposite direction, effectively canceling electromagnetic fields coming from outside the coil loop, but doubling the voltage induced in the coil 110. Alternatively, one wire loop may be returned through the center of the coil loop to achieve the same effect.

Figure 2:
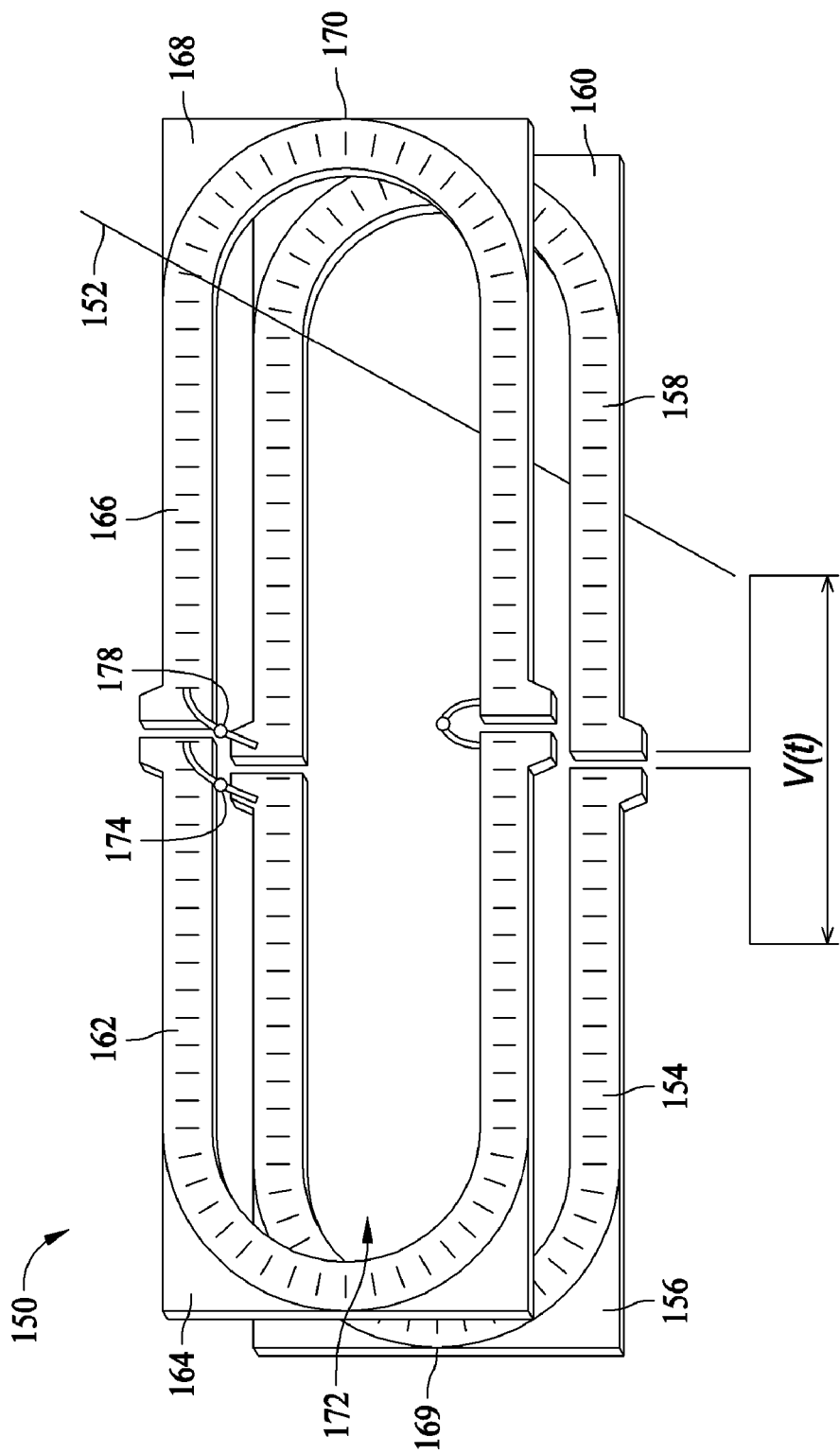
FIG. 2 is a perspective view of a known Rogowski coil for the system of FIG. 1.

FIG. 2 illustrates a known coil assembly 150 that may be fabricated with a high degree of precision. The coil assembly 150 is formed as a Rogowski coil for receiving an electrical conductor 152. In the coil assembly 150, conductive elements are formed or traced on a number of printed circuit board cores with each of the conducting elements on the cored defining a quarter of the entire coil. In particular, the coil assembly 150 includes a first portion 154 that is traced in a first direction on a first PCB core 156 and a second portion 158 that is traced in the first direction on a second PCB core 160. The first direction may be clockwise or counterclockwise. The coil assembly 150 also includes a third portion 162 that is traced in a second direction on a third PCB core 164 and a fourth portion 166 that is traced in the second direction on a fourth PCB core 168. The third and fourth PCB cores 164, 168 are distinct from either of the first or second PCB cores 156, 160. In this way, the third coil portion 162 and the fourth portion 166 are "decoupled" from the first and second coil portions 154 and 158. Moreover, the second direction is different from the first direction on the respective cores. Thus, if the first direction is clockwise, then the second direction is counterclockwise, and if the first direction is counterclockwise, then the second direction is clockwise.

Each of the PCB cores 156, 160, 164, 168 is formed as a thinly shaped piece defined by two opposing surfaces. The conductive elements of the coil assembly 150 are traced onto the respective PCB core by depositing a metal (such as, for example, copper) onto each of the surfaces of the PCB cores in a known manner. As shown, the metal deposits are rectilinear and radial, depending on their location on the PCB, and form a rectangular/elliptical shape. Other shapes may be formed, including, for example, circular, triangular, or rectangular shapes. In particular, the metal deposits may be all radial, with geometric projections intersecting at a center of the coil, to form a circular coil (not shown). Alternatively, the metal deposits may be all rectilinear to form a rectangular coil (not shown).

When the coil portions 154, 158, 162, 166 are so arranged, the first portion 154 mates with the second portion 158 to form a first loop 169 and the third portion 162 mates with the fourth portion 166 to form a second loop 170. In this arrangement, an inner area 172 is formed within the first and second loops 169, 170 respectively, for receiving the electrical conductor 152.

The first and third portions 154, 162 are connected at a first connection point 174 and the third and fourth portions 158, 166 are connected at a second connection point 176. The fourth and second portions 166, 158 are connected at a third connection point 178. The voltage v(t) induced in the coil assembly 150 is measured across the first and second portions 154, 158 of the coil assembly 150 in a series configuration.

Additional details of the coil assembly 150 are disclosed in U.S. Pat. No. 6,680,608, the entire disclosure of which is hereby incorporated by reference in its entirety.

Figure 3:
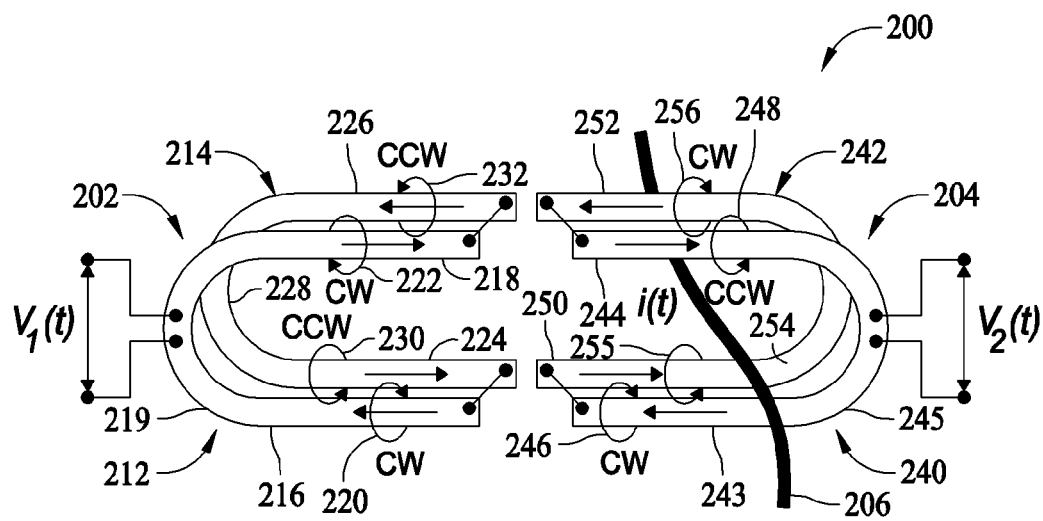
FIG. 3 is a perspective view of a split coil assembly according to the present invention.
Figure 4:
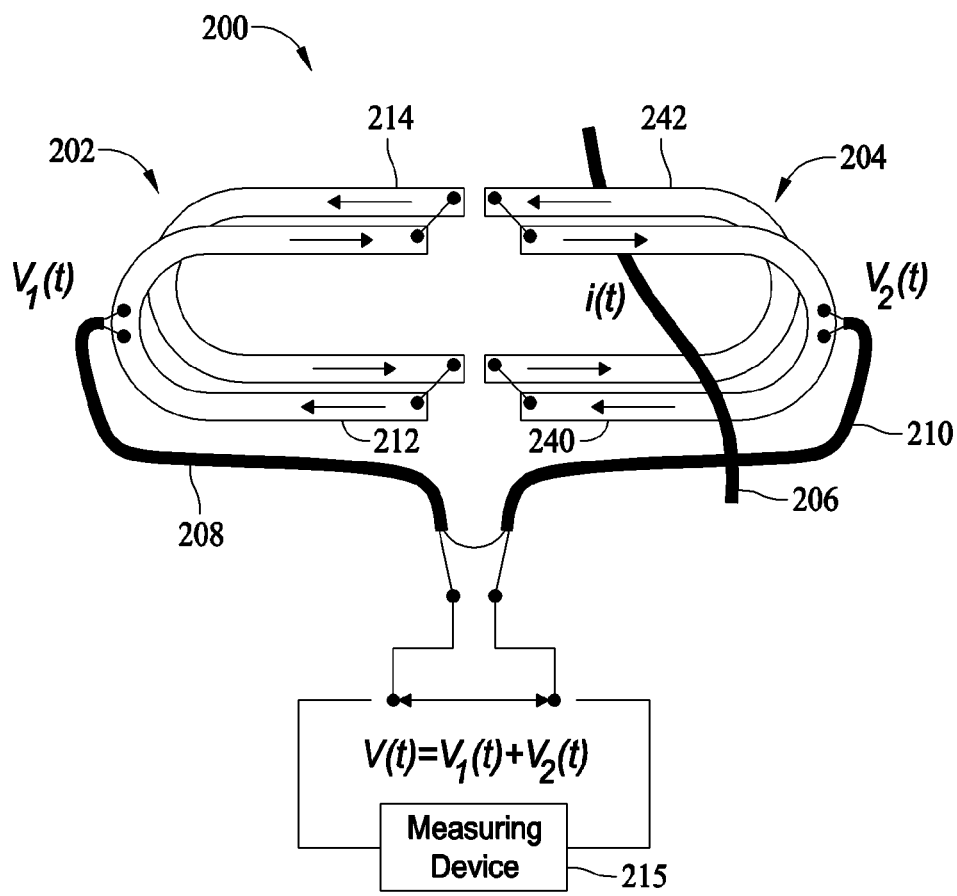
FIG. 4 illustrates interconnection of the coil portions in the assembly of FIG. 3.

FIGS. 3 and 4 illustrate perspective views of a split coil assembly 200 according to the present invention that may be utilized in the system 100 (FIG. 1) in lieu of the coil 110. The coil assembly 200 may include a first PCB assembly 202 and a second PCB assembly 204 each defining approximately one half of the larger coil assembly 200. Each PCB assembly 202, 204 may be installed over an existing conductor 206 without electrically disconnecting the conductor 206 from the circuit. Each PCB assembly 202, 204 may be also be configured with taps or connections for respective interface conductors, wires or cables 208 and 210 (FIG. 4) for referencing the respective voltage outputs $v_1(t)$ and $v_2(t)$ of the PCB assemblies 202 and 204 as shown in FIG. 4. The interface cables 208 and 210 connect the PCB assemblies in series to one another, and a third output V(t), equal to the sum of $v_1(t)$ and $v_2(t)$ of the PCB assemblies 202 and 204, is input to and referenced by the measuring device 215, which may be a protective relay device.

In an illustrative embodiment, the first PCB assembly 202 may include first and second PCBs 212, 214 each having conductive traces or windings forming portions of the larger coil assembly 200 with the traces or windings extending thereon in different directions (e.g., clockwise or counter-clockwise). More specifically, the first PCB 212 is U-shaped in an exemplary embodiments and accordingly includes a first elongated leg 216 and a second elongated leg 218 connected by a rounded bend 219. The first and second legs 216 and 218 extend generally parallel to one another and are spaced apart to define an opening therebetween for the passage of the conductor 206. A first coil portion 220 may be formed on the first leg 216 and define a winding that extends or turns in a clockwise direction as indicated in FIG. 3. A second coil portion 222 may be formed on the second leg 218 and define a winding that also extends or turns in a clockwise direction. That is, the coil portions 220 and 222 in the first PCB 212 each extend in the same clockwise direction in an exemplary embodiment. While one exemplary shape of the PCB 212 is illustrated in the Figures, it is understood that other shapes may likewise be used as desired without departing from the scope of the present invention.

The second PCB 214 may be shaped similarly to the first PCB 212, and may include a third leg 224 and a fourth leg 226 spaced apart from one another and connected by a bend 228. A third coil portion 230 may be formed on the third leg 224 and may define a winding that extends or turns in a counter-clockwise direction as indicated in FIG. 3. A fourth coil portion 232 may be formed on the fourth leg 226 and may define a winding that extends or turns in a counter clockwise direction. That is, the coil portions 220 and 222 in the first PCB 212 may each extend in the same counter-clockwise direction.

As indicated in FIG. 3, the third coil portion 230 of the second PCB 214 may be series connected to the first coil portion 220 of the first PCB 212, and the second coil portion 222 of the first PCB 212 may be series connected to the fourth coil portion 232 of the second PCB 214. Consequently, a continuous coil loop or conductive path may be established in the first PCB assembly 202 from the second coil portion 222 to the fourth coil portion 232, from the fourth coil portion 232 to the third coil portion 230, and from the third coil portion 230 to the first coil portion 220.

The voltage reference taps for the first PCB assembly 202 may correspond to the respective ends of the first coil portion 220 and the second coil portion 222, and in an exemplary embodiment the taps are located on the bend 219 of the first PCB 212. The taps could alternatively be provided in another location, such as on the legs 216, 218 of the first PCB 212, at any location on the second PCB 214, or one tap may be provided on the first PCB 212 and another tap may be provided on the second PCB 214.

It is noted that the first PCB assembly 202 includes two coil portions 220 and 222 on the first PCB 212 that extend in a clockwise direction, and two coil portions 230, 232 on the second PCB that extend in a counterclockwise direction, thereby canceling external electromagnetic fields coming from outside the loop of the first PCB assembly 202. The coil loop of the first PCB assembly 202 is established entirely in the first PCB assembly 202, and the coil loop of the first PCB assembly 202 is not joined to any portion of the second PCB assembly 204.

In an exemplary embodiment the second PCB assembly 204 may include third and fourth PCBs 240, 242 having conductive traces or windings forming portions of the larger coil assembly 200 with the traces or windings extending thereon in different directions (e.g., clockwise or counter-clockwise). More specifically, in an illustrative embodiment, the third and fourth PCBs 240, 242 are similarly shaped to the PCBs 212 and 214 in the first PCB assembly 202. That is, the third PCB 240 may include a fifth leg 243 and a sixth leg 244 connected by a bend 245. The fifth and sixth legs 243 and 244 are spaced apart from one another and define an opening therebetween for the passage of a conductor. A fifth coil portion 246 may be formed on the fifth leg 243 and may define a winding that turns or extends in a clockwise direction as indicated in FIG. 3. A sixth coil portion 248 may be formed on the sixth leg 244 and may define a winding that turns or extends in a counter-clockwise direction.

The fourth PCB 242 may be shaped similarly to the third PCB 240, and may include a seventh leg 250 and an eighth leg 252 spaced apart from one another and connected by a bend 254. A seventh coil portion 255 may be formed on the seventh leg 250 and may define a winding that turns or extends in a counter-clockwise direction as indicated in FIG. 3. An eighth coil portion 256 may be formed on the eighth leg 252 and may define a winding that turns or extends in a clockwise direction. That is, the coil portions on each of the third and fourth PCBs 240, 242 of the second PCB assembly 204 extend in different directions, unlike the PCBs 212, 214 in the first PCB assembly 202 wherein the coil portions on the respective PCBs 212, 214 extend in the same direction. Unlike known coil assemblies, the coil portions of first PCB assembly 202 and the second PCB assembly 204 are not formed as mirror images of one another. Rather, the PCB assemblies 202 and 204 are uniquely constructed with different sequences and directions of coils on the legs of the PCBs.

As indicated in FIG. 3, the fifth coil portion 246 of the third PCB 240 is series connected to the seventh coil portion 255 of the fourth PCB 242, and the sixth coil portion 248 of the third PCB 240 is series connected to the eighth coil portion 256 of the fourth PCB 242. Consequently, a continuous coil loop is provided in the second PCB assembly 204 from the fifth coil portion 246 to seventh coil portion 255, from the seventh coil portion 255 to the eighth coil portion 256, and from the eighth coil portion 256 to the sixth coil portion 248. The coil loop of the second PCB assembly 204 is established entirely in the second PCB assembly 204, and the coil loop of the second PCB assembly 204 is not joined to any portion of the first PCB assembly 202.

The voltage reference taps for the second PCB assembly 204 correspond to the respective ends of the fifth coil portion 246 and the sixth coil portion 248, although it is understood that the voltage reference taps could be located elsewhere on one or both of the PCBs 240, 242. It is noted that the second PCB assembly 204 includes two coil portions 246 and 256 extending in a clockwise direction, and two coil portions 248 and 256 extending in a counterclockwise direction, thereby canceling external electromagnetic fields coming from outside the loop of the first PCB assembly 212.

The first and second PCB assemblies 202 and 204 may be separately fabricated with a high degree of precision, and may be separately provided in different parts and used in combination to form the split Rogowski coil assembly 200. Using distinct coil loops in the respective first and second PCB coil assemblies 202 and 204 that are unconnected to one another in the construction of the coil assemblies, installation over the conductor 206 is simplified in comparison to, for example, the coil assembly 150 shown in FIG. 2 wherein split coil assemblies are interconnected in series at the point 176. That is, instead of a direct connection or direct current path between the PCB assemblies to form a single loop, the assembly 200 of the present invention utilizes separate loops in each PCB assembly 202, 204 that are indirectly connected by virtue of the interface cables 208, 210.

The absence of a direct current path between the coil loops formed in the first and second PCB assemblies 202, 204 also advantageously provides for the respective voltage outputs $v_1(t)$ and $v_2(t)$ for each of the PCB assemblies 202 and 204, unlike the coil assembly 150 having a single voltage output. Multiple signal outputs $v_1(t)$ and $v_2(t)$ provides for convenient connection of the PCB assemblies 202 and 204 with the respective interface cables 208, 210 at the location of the coil assembly 200, at the location of the measuring device 215 (FIG. 4), or elsewhere as desired. Additionally, connecting the PCB assemblies 202 and 204 in series utilizing the cables 208 and 210 is much easier than connecting, for example, the split coil portions of the assembly 150 in series at the point 176 (FIG. 2). Greater flexibility and ease of installation is provided by virtue of the distinct coil loops in the first and second PCB assemblies 202 and 204.

In comparison to the coil assembly 150 and known Rogowski coils fabricated from PCBs, the split coil assembly 200 provides for easier installation over a conductor 206 and simpler and more convenient connection to the interface cables 208, 210, while preserving accuracy of the coil assembly 200 by rejecting or canceling influences of external electromagnetic fields.

One embodiment of a Rogowski coil assembly is disclosed herein. The assembly comprises a first Rogowski coil portion surrounding a first portion of a conductor and generating a first voltage output signal; and a second Rogowski coil portion adjacent to the first Rogowski coil portion and surrounding a second portion of the conductor and generating a second voltage output signal. The first voltage output signal and the second voltage output signal are combined to provide a third output signal, the third output signal being processed to determine a current flowing through the conductor.

Optionally, the third output signal is integrated to determine the current flowing through the conductor. Each of the first coil portion and the second coil portion may comprise a plurality of printed circuit boards, at least two of the plurality of printed circuit boards having windings connected in opposite directions. The first coil portion and the second coil portion are separately provided and installed around the conductor.

An embodiment of a Rogowski coil assembly is also disclosed. The assembly comprises a first printed circuit board assembly comprising a first pair of circuit boards, each of the first pair of circuit boards having sections of coil formed thereon, and the sections' of coil connected in series with one another to form a larger section of coil. The first pair of circuit boards define a first coil loop generating a first voltage output when placed around a conductor. A second printed circuit board assembly is separately provided from the first printed circuit board assembly, and the second printed circuit board assembly comprises a second pair of circuit boards, each of the second pair of circuit boards having sections of coil formed thereon, and the sections of coil connected in series with one another to form a larger section of coil. The second pair of circuit boards define a second coil loop generating a second voltage output when placed around the conductor. A total voltage output of the coil is the sum of the first voltage output and the second voltage output.

Optionally, the first pair of circuit boards includes coil sections that are wound in the same direction on each printed circuit board. The second pair of circuit boards may include coil sections wound in opposite directions on each printed circuit board. The first and second pair of circuit boards may be connected in series with one another to provide the total voltage output of the coil while the first coil loop and the second coil loop are not joined.

An embodiment of a Rogowski coil system is also disclosed. The system comprises a conductor, a Rogowski coil formed in at least two distinct portions separately provided from one another and having unconnected coil loops in the respective portions. Each of the portions generate a respective voltage output when an energized conductor is passed through the coil, and a measuring device combining a respective voltage output signal of the distinct coil portions.

Optionally, each of the coil loops are formed on a pair of printed circuit boards connected in series to one another. A current calculating device may be provided, with, the current calculating device determining the current in the conductor using the combined voltage signals The combined voltage signal may be integrated to determine the current flowing through the conductor. The distinct portions may each comprise a plurality of printed circuit boards having windings connected in opposite directions. The windings may be connected in series with one another.

A method of monitoring current with a Rogowski coil assembly is also disclosed. The method comprises providing a first Rogowski coil section forming a first portion of a Rogowski coil; providing a second Rogowski coil section forming a second portion of the Rogowski coil; positioning the first and second Rogowski coil sections about a conductor without directly connecting the first and second Rogowski coil sections; obtaining distinct voltage outputs from each of the first and second Rogowski coil sections; and summing a voltage output of the first and second Rogowski coil sections.

Optionally, the method may further comprise integrating the summed voltage outputs to provide a signal corresponding to the current flowing in the conductor. The method may also comprise connecting the summed voltage output to a voltage measuring device.

An embodiment of a split Rogowski coil is also provided. The coil comprises a separately provided first coil assembly and a second coil assembly each defining a distinct closed loop portion of the Rogowski coil when installed around a conductor. The current flowing through the conductor is proportional to the sum of the voltages generated in the first and second coil assemblies.

Optionally, each of the first and second coil assemblies comprises a plurality of circuit boards having windings connected in opposite directions. One of the first and second coil assemblies may comprise a pair of circuit boards. One of the circuit boards including coil sections wound in the same direction and one of the circuit boards including coil sections wound in opposite direction. Interface cables may connect the first coil assembly and the second coil assembly in series. The closed loop portions are not directly connected with one another in each of the first coil assembly and the second coil assembly.

While the invention has been described in terms of various specific embodiments, those skilled in the art will recognize that the invention can be practiced with modification within the spirit and scope of the claims.

What is claimed is:

1. A Rogowski coil assembly, comprising:
a first printed circuit board assembly comprising first and second circuit boards disposed in a stacked relationship with respect to each other, the first and second circuit boards together comprising a concave shape defined by a first end and a second end of the first printed circuit board assembly, the concave shape configured to define an opening to allow for passage of a conductor between the first end and the second end of the first printed circuit board assembly, the first circuit board having a first section of coil formed thereon, the first section of coil comprising first and second ends, the second circuit board having a second section of coil formed thereon, the second section of coil comprising a third end and a fourth end, the first and third ends and the second and fourth ends of the first and second sections of coil, respectively, being connected in series with one another to form a first larger continuous coil loop generating a first voltage output when placed around a conductor; and
a second printed circuit board assembly separately provided from the first printed circuit board assembly, the second printed circuit board assembly comprising third and fourth circuit boards disposed in a stacked relationship with respect to each other, the third and fourth circuit boards together comprising a concave shape defined by a first end and a second end of the second printed circuit board assembly, the concave shape configured to define an opening to allow for passage of a conductor between the third end and the fourth end of the second printed circuit board assembly, the third circuit board having a third section of coil formed thereon, the third section of coil comprising first and second ends, the fourth circuit board having a fourth section of coil formed thereon, the fourth section of coil comprising a third end and a fourth end, the first and third ends and the second and fourth ends of the third and fourth sections of coil, respectively, being connected in series with one another to form a second larger continuous coil loop, generating a second voltage output when placed around the conductor,
wherein the first larger continuous coil loop is not electrically coupled to the second larger continuous coil loop, and
wherein a total voltage output of the coil assembly is the sum of the first voltage output and the second voltage output.

2. The Rogowski coil assembly of claim 1, wherein the first and second circuit boards comprise coil sections that are wound in the same direction on each printed circuit board.

3. The Rogowski coil assembly of claim 1, wherein the third and fourth circuit boards comprise coil sections wound in opposite directions on each printed circuit board.

4. The Rogowski coil assembly of claim 1, wherein the first voltage output and the second voltage output are connected in series with one another to provide the total voltage output of the coil.

5. The Rogowski coil assembly of claim 1, wherein the first coil loop and the second coil loop are not joined.

6. The Rogowski coil assembly of claim 1, wherein the first voltage output and the second voltage output are measured at a location other than at ends of the respective coils.

7. The Rogoswski coil assembly of claim 1, wherein the first and second printed circuit board assemblies are substantially U-shape.

8. The Rogowski coil assembly of claim 1, wherein the total voltage output of the coil assembly is integrated to determine the current flowing through the conductor.

9. The Rogowski coil assembly of claim 1, wherein the first printed circuit board assembly and the second printed circuit board assembly are configured to be installed around the conductor without disconnecting the conductor.

10. The Rogowski coil assembly of claim 1, further comprising a current calculating device that determines the current in the conductor using the total voltage output.

11. The Rogowski coil assembly of claim 10, wherein the current calculating device is a computer.

12. The Rogowski coil assembly of claim 1, further comprising a voltage measuring device coupled to the first voltage output and the second voltage output.

13. The Rogowski coil assembly of claim 1, wherein the first printed circuit board assembly does not completely surround the conductor, and the second printed circuit board assembly does not completely surround the conductor.

14. The Rogowski coil assembly of claim 1, wherein the first, second, third, and fourth sections of coil are formed by depositing metal onto the first, second, third, and fourth circuit boards, respectively.

15. The Rogowski coil assembly of claim 14, wherein the metal is copper.

* * * * *